US012322431B2

(12) United States Patent
Gu

(10) Patent No.: US 12,322,431 B2
(45) Date of Patent: Jun. 3, 2025

(54) REFRESH ADDRESS GENERATION CIRCUIT AND METHOD, MEMORY, AND ELECTRONIC DEVICE

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 210 days.

(21) Appl. No.: 18/332,706

(22) Filed: Jun. 9, 2023

(65) Prior Publication Data
US 2023/0386546 A1    Nov. 30, 2023

Related U.S. Application Data

(63) Continuation of application No. PCT/CN2022/129530, filed on Nov. 3, 2022.

(30) Foreign Application Priority Data

May 30, 2022    (CN) .......................... 202210601863.9

(51) Int. Cl.
| G11C 11/406 | (2006.01) |
| G11C 8/18 | (2006.01) |
| G11C 11/408 | (2006.01) |

(52) U.S. Cl.
CPC ....... *G11C 11/406* (2013.01); *G11C 11/40611* (2013.01); *G11C 8/18* (2013.01); *G11C 11/40618* (2013.01); *G11C 11/408* (2013.01)

(58) Field of Classification Search
CPC ............. G11C 11/406; G11C 11/40611; G11C 11/40618; G11C 11/408; G11C 8/18
(Continued)

(56) References Cited

U.S. PATENT DOCUMENTS

| 11,568,917 B1 * | 1/2023 | Shin .................... G11C 11/4078 |
| 2004/0032772 A1 | 2/2004 | Takahashi |

(Continued)

FOREIGN PATENT DOCUMENTS

| CN | 105304118 A | 2/2016 |
| CN | 112382321 A | 2/2021 |

(Continued)

OTHER PUBLICATIONS

International Search Report in the international application No. PCT/CN2022/129530, mailed on Feb. 22, 2023.

(Continued)

*Primary Examiner* — Ly D Pham
(74) *Attorney, Agent, or Firm* — Syncoda LLC; Feng Ma

(57) ABSTRACT

A refresh address generation circuit includes: a refresh control circuit configured to sequentially receive first refresh commands and perform first refresh operations respectively, output a first clock signal when the number of the first refresh operations is less than a preset value or output a second clock signal when the number of the first refresh operations is equal to the preset value n, where n is a positive integer greater than or equal to 1; an address generator coupled to refresh control circuit, pre-storing a first address, receiving the first clock signal or the second clock signal, outputting a first to-be-refreshed address in response to the first clock signal during each first refresh operation, the first to-be-refreshed address includes the first address, and changing the first address in response to the second clock signal.

20 Claims, 8 Drawing Sheets

(58) Field of Classification Search
USPC .......................................................... 365/222
See application file for complete search history.

(56) References Cited

U.S. PATENT DOCUMENTS

| | | |
|---|---|---|
| 2006/0198207 A1 | 9/2006 | Ishikawa |
| 2008/0013392 A1 | 1/2008 | Ishikawa |
| 2014/0016422 A1* | 1/2014 | Kim .................. G11C 11/40603 |
| | | 365/222 |
| 2016/0005456 A1 | 1/2016 | Ko |
| 2017/0186481 A1 | 6/2017 | Oh et al. |
| 2020/0194056 A1 | 6/2020 | Sakurai et al. |
| 2023/0386547 A1* | 11/2023 | Gu ......................... G11C 11/406 |

FOREIGN PATENT DOCUMENTS

| | | |
|---|---|---|
| CN | 112837727 A | 5/2021 |
| CN | 113342615 A | 9/2021 |
| CN | 114420181 A | 4/2022 |
| CN | 114822633 A | 7/2022 |
| EP | 4328913 A1 | 2/2024 |
| JP | 2006244667 A | 9/2006 |
| JP | 7064633 B1 | 5/2022 |

OTHER PUBLICATIONS

Extended European search report in application No. 22941857, mailed on Aug. 30, 2024.
TW second office action in application No. 112101068, issued on May 2, 2024.
First Office Action of the Taiwanese application No. 112101068, issued on Jan. 3, 2024, 6 pages with English translation.

* cited by examiner

REFRESH ADDRESS GENERATION CIRCUIT AND METHOD, MEMORY, AND ELECTRONIC DEVICE

CROSS-REFERENCE TO RELATED APPLICATIONS

This is a continuation application of International Patent Application No. PCT/CN2022/129530 filed on Nov. 3, 2022, which claims priority to Chinese Patent Application No. 202210601863.9 filed on May 30, 2022. The disclosures of the above-referenced applications are hereby incorporated by reference in their entirety.

BACKGROUND

As technologies develop and progress, some dynamic random access memories (DRAMs) have a same bank refresh mode in addition to an all bank refresh mode during refreshing. In the same bank refresh mode, a same address in multiple banks needs to be refreshed. This requires an address generation circuit that can implement same bank refreshing.

It should be noted that the information disclosed above is merely intended to facilitate a better understanding of the background of the present disclosure, and therefore may include information that does not constitute the prior art known to those of ordinary skill in the art.

SUMMARY

The present disclosure relates to the technical field of semiconductors, and in particular, to a refresh address generation circuit and method, a memory, and an electronic device.

According to a first aspect of the present disclosure, a refresh address generation circuit is provided. The refresh address generation circuit includes a refresh control circuit and an address generator.

The refresh control circuit is configured to sequentially receive multiple first refresh commands, and performs first refresh operations respectively. The refresh control circuit is further configured to: output a first clock signal under a condition that the number of the first refresh operations is less than a preset value, or output a second clock signal under a condition that the number of the first refresh operations is equal to the preset value n, where n is a positive integer greater than or equal to 1.

The address generator is coupled to the refresh control circuit, configured to pre-store a first address to receive the first clock signal or the second clock signal. The address generator is further configured to: output a first to-be-refreshed address in response to the first clock signal during each of the first refresh operations, the first to-be-refreshed address includes the first address; and change the first address in response to the second clock signal.

It should be understood that the foregoing general description and the following detailed description are merely exemplary and explanatory, and should not be construed as a limitation to the present disclosure.

BRIEF DESCRIPTION OF THE DRAWINGS

The foregoing and other features and advantages of the present disclosure will become more apparent by describing exemplary embodiments in detail with reference to the accompanying drawings.

DETAILED DESCRIPTION

Figure 1:
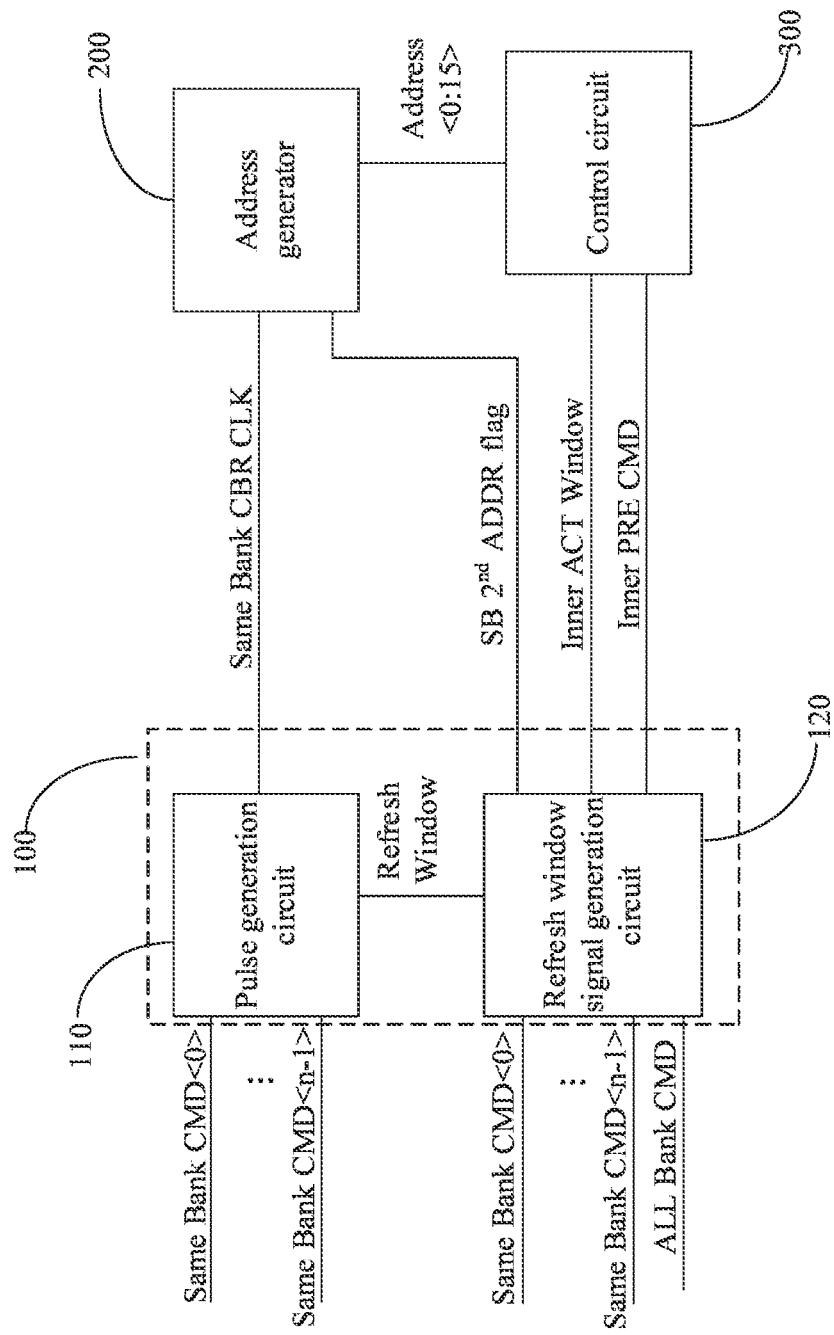
FIG. 1 is a schematic diagram of a first refresh address generation circuit according to an exemplary embodiment of the present disclosure.
Figure 2:
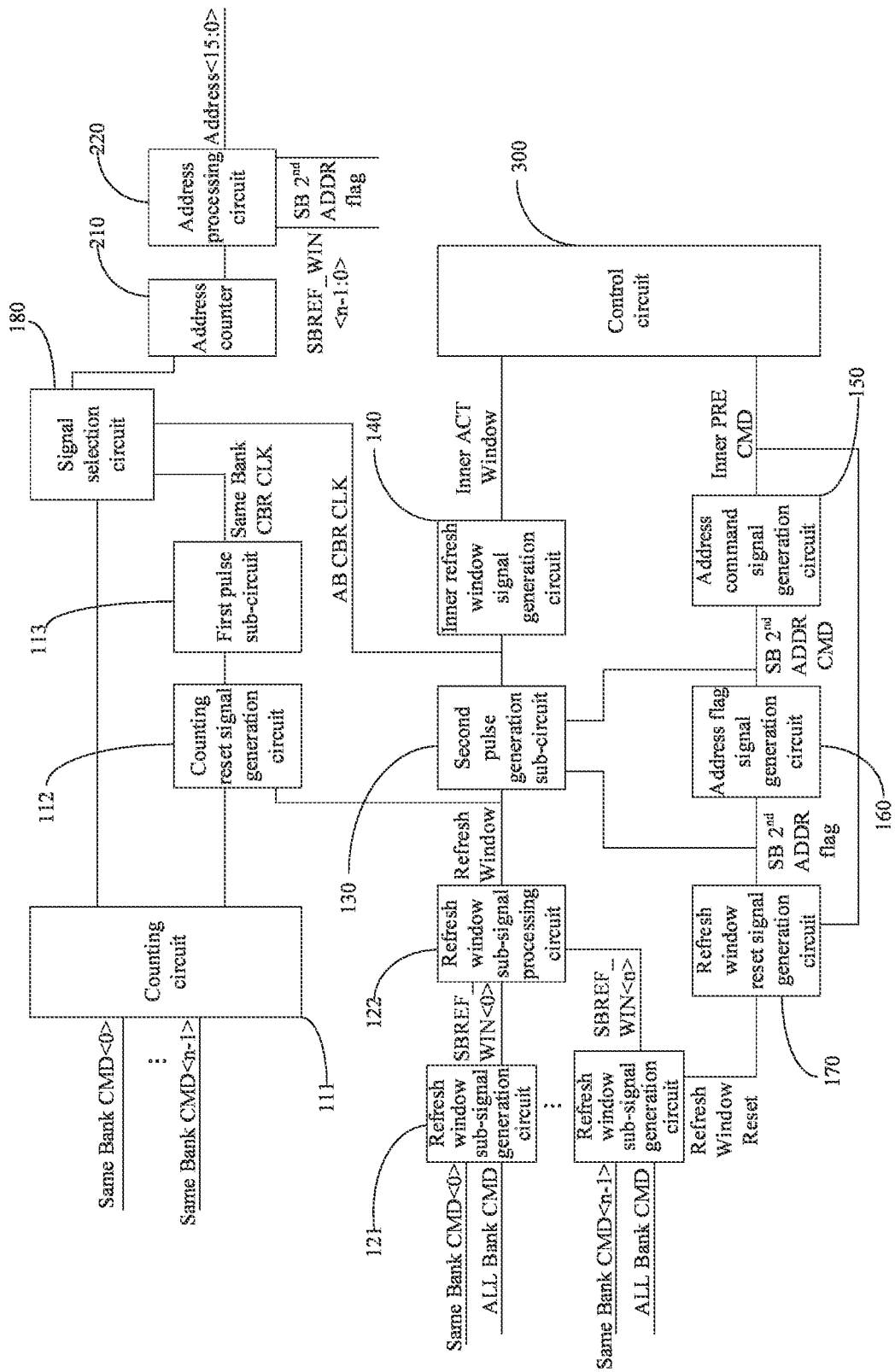
FIG. 2 is a schematic diagram of a second refresh address generation circuit according to an exemplary embodiment of the present disclosure.
Figure 3:
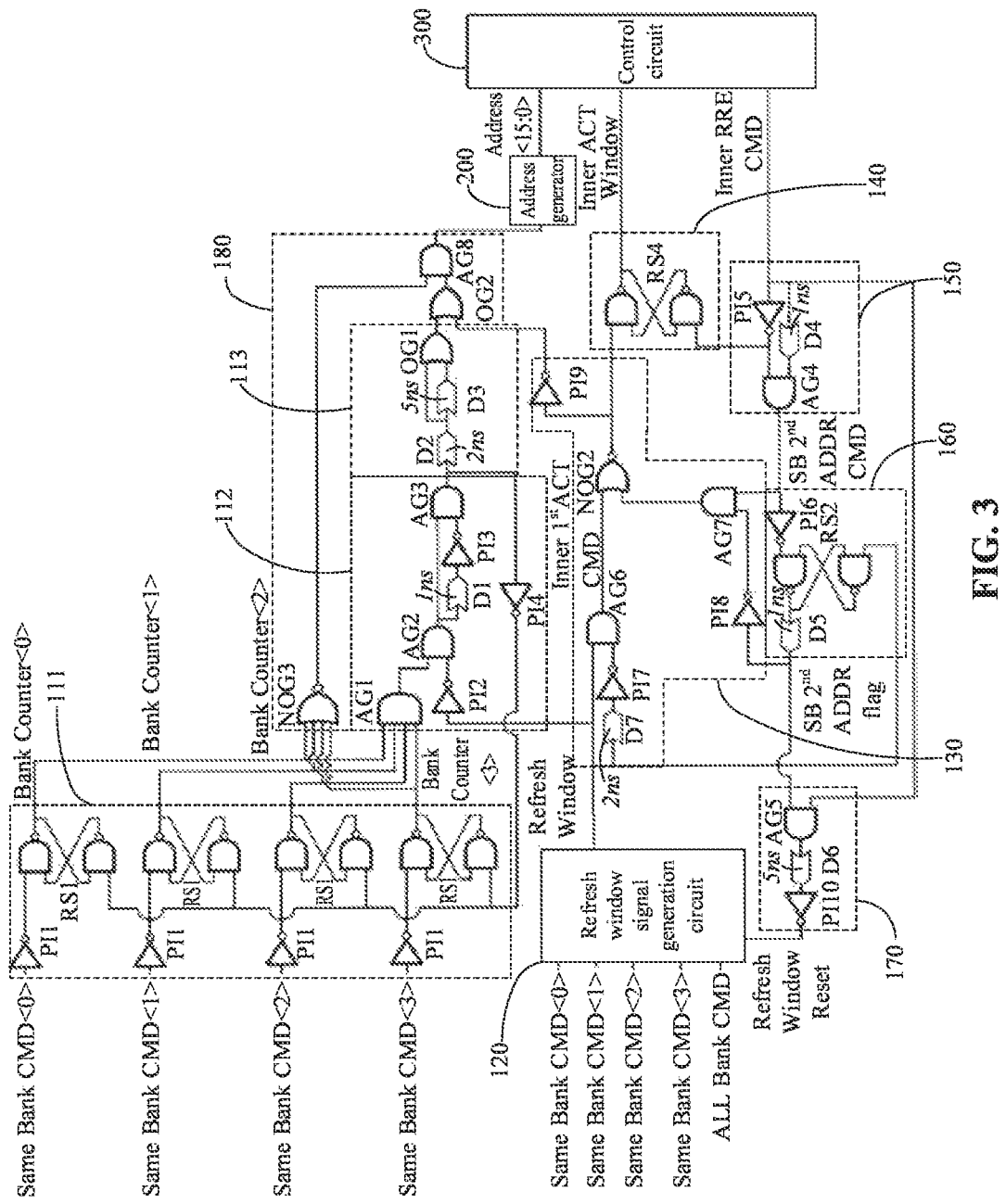
FIG. 3 is a schematic diagram of a third refresh address generation circuit according to an exemplary embodiment of the present disclosure.
Figure 4:
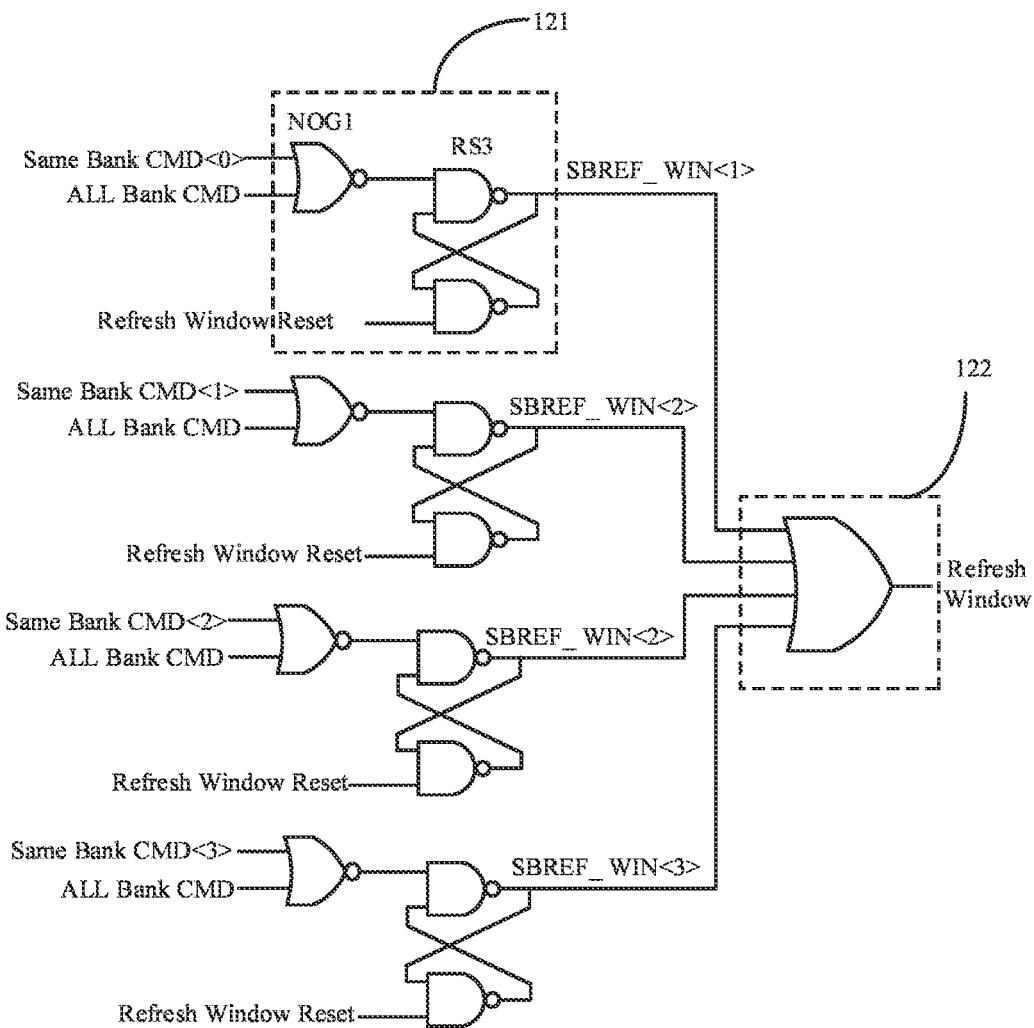
FIG. 4 is a schematic diagram of a first refresh window signal generation circuit according to an exemplary embodiment of the present disclosure.
Figure 5:
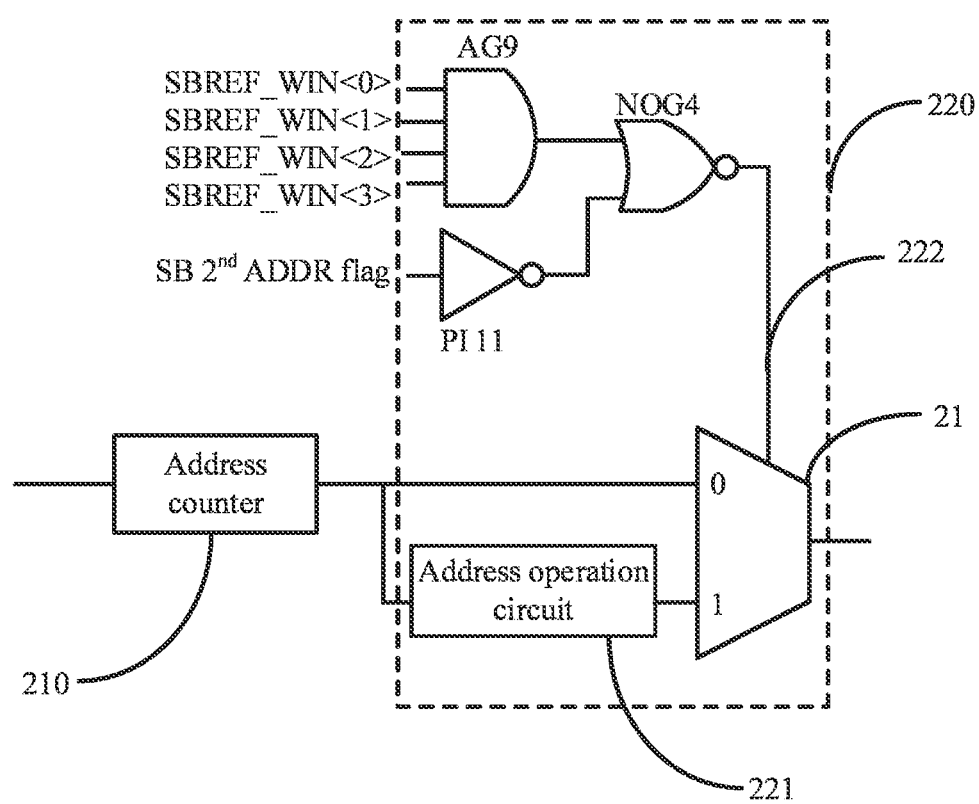
FIG. 5 is a schematic diagram of an address generator according to an exemplary embodiment of the present disclosure.

Exemplary embodiments will be described below comprehensively with reference to the accompanying drawings. However, the exemplary embodiments may be implemented in various forms, and should not be construed as being limited to those described herein. On the contrary, these exemplary embodiments are provided to make the present disclosure comprehensive and complete and to fully convey the concept manifested therein to those skilled in the art. Same reference numerals in the figures indicate same or similar parts, and thus their repetitive descriptions will be omitted.

The described features, structures, or characteristics may be incorporated into one or more embodiments in any suitable manner. In the following description, many specific details are provided to give a full understanding of the embodiments of the present disclosure. However, those skilled in the art will be aware that the technical solutions of the present disclosure may be practiced with one or more of the specific details omitted, or other methods, components, materials, apparatuses, operations, and the like may be used. In other cases, well-known structures, methods, apparatuses, implementations, materials, or operations are not shown or described in detail to avoid obscuring aspects of the present disclosure.

The block diagrams shown in the accompanying drawings are merely functional entities, which do not necessarily correspond to physically independent entities. That is, these functional entities or a portion of these functional entities may be implemented in a form of software, or implemented in one or more software-hardened modules, or these functional entities may be implemented in different networks and/or processor apparatuses and/or microcontroller apparatuses.

In a Double Data Rate SDRAM 5 (DDR 5), it not only has an all bank refresh mode following DDR4, but also has a same bank refresh mode.

In the all bank refresh mode, all banks are simultaneously refreshed. In other word, simultaneously refreshed addresses in all banks are the same. In some implementations, output of a counter is used as a refresh address generator. At the end of each row refresh, the output of the counter is incremented by 1 as a refresh address for a next row. When all rows are refreshed, the counter is reset, and then the count is restarted to start a next refresh cycle.

In the same bank refresh mode, the same bank in different bank groups are simultaneously refreshed row by row. In other words, a same row of different banks cannot be simultaneously refreshed in this mode. The refresh address generator in some implementations encounters a problem of address generation and storage.

The exemplary embodiments of the present disclosure first provide a refresh address generation circuit. As illustrated in FIG. 1, the refresh address generation circuit includes a refresh control circuit 100 and an address generator 200. The refresh control circuit 100 is configured to sequentially receive multiple first refresh commands Same Bank CMD, and perform first refresh operations respectively. The refresh control circuit is further configured to output a first clock signal under a condition that the number of the first refresh operations is less than a preset value, or output a second clock signal under a condition that the number of the first refresh operations is equal to the preset value n, where n is a positive integer greater than or equal to 1. The address generator 200 is coupled to the refresh control circuit 100, and is configured to pre-store a first address and receive the first clock signal or the second clock signal. During each first refresh operation, the address generator 200 is configured to output a first to-be-refreshed address in response to the first clock signal. The first to-be-refreshed address includes the first address. The address generator 200 is configured to change the first address in response to the second clock signal.

The refresh address generation circuit provided in the embodiments of the present disclosure includes the refresh control circuit 100 and the address generator 200. The refresh control circuit 100 is configured to sequentially receive the multiple first refresh commands Same Bank CMD, and perform the first refresh operations respectively. The refresh control circuit is further configured to output the first clock signal under a condition that the number of the first refresh operations is less than the preset value or output the second clock signal under a condition that the number of the first refresh operations is equal to the preset value n. The address generator 200 is coupled to the refresh control circuit 100, and is configured to pre-store the first address and receive the first clock signal or the second clock signal. The address generator 200 is configured to output the first to-be-refreshed address in response to the first clock signal. The first to-be-refreshed address includes the first address. After outputting the first to-be-refreshed address, the address generator 200 is configured to change the first address in response to the second clock signal such that a refresh address is provided to a memory in a same bank refresh mode.

It should be noted that in the embodiments of the present disclosure, "coupled" includes directly electrically connected and electrically connected through another electrical element (such as a resistor, a delayer, or an inverter). "Coupled" appearing hereinafter includes these manners, and details are not described hereinafter again.

Each part of the refresh address generation circuit provided in the embodiments of the present disclosure is described in detail below.

The refresh control circuit 100 may include a refresh window signal generation circuit 120 and a clock pulse generation circuit 110. The refresh window signal generation circuit 120 is configured to receive the first refresh commands Same Bank CMD and a refresh window reset signal Refresh Window Reset, and is further configured to generate a refresh window signal Refresh Window based on the first refresh commands Same Bank CMD and the refresh window reset signal Refresh Window Reset. A pulse duration of the refresh window signal Refresh Window is a window duration for the refresh control circuit 100 to perform one refresh operation. The refresh window reset signal Refresh Window Reset is used to reset the refresh window signal generation circuit 120 after the refresh operation ends. The clock pulse generation circuit 110 is coupled to the refresh window signal generation circuit 120, and configured to: under a condition that the number of the first refresh commands Same Bank CMD received by the clock pulse generation circuit 110 is less than or equal to n, generate the first clock signal before the n-th first refresh operation ends; or under a condition that the number of the first refresh commands Same Bank CMD received by the clock pulse generation circuit 110 is n, generate the second clock signal after the n-th refresh operation ends.

The first refresh commands Same Bank CMD may be same bank refresh commands. The number of the first refresh commands Same Bank CMD may be the same as the number of banks. For example, a bank group in the memory has n (n is a positive integer greater than or equal to 2) banks, then the number of the first refresh commands Same Bank CMD may be n. The n first refresh commands Same Bank CMD may be sequentially input to the refresh window signal generation circuit 120 and the clock pulse generation circuit 110. The clock pulse generation circuit 110 keeps outputting the first clock signal before the n first refresh commands Same Bank CMD are sequentially input to the refresh window signal generation circuit 120 and the clock pulse generation circuit 110. After the n first refresh commands Same Bank CMD are sequentially input to the refresh window signal generation circuit 120 and the clock pulse generation circuit 110, the clock pulse generation circuit 110 outputs the second clock signal in response to the n first refresh commands Same Bank CMD. Same bank refresh clock signals Same Bank CBR CLK include the first clock signal and the second clock signal. The second clock signal is a pulse signal. The first clock signal is kept at a low level.

The clock pulse generation circuit 110 includes a counting circuit 111, a counting reset signal generation circuit 112, and a first pulse generation sub-circuit 113. The counting circuit 111 is configured to receive the first refresh commands Same Bank CMD and a counting reset signal Bank Counter Reset, to count the first refresh commands Same Bank CMD and output a counting signal Bank Counter. The counting circuit 111 is reset based on the counting reset signal Bank Counter Reset. The counting reset signal generation circuit 112 is coupled to the counting circuit 111 and the refresh window signal generation circuit 120, and is configured to: under a condition that the number of the first refresh commands Same Bank CMD is n, generate the counting reset signal Bank Counter Reset after the n-th first refresh operation ends. The first pulse generation sub-circuit 113 is coupled to the counting reset signal generation circuit 112, and configured to generate the first clock signal based on the counting signal Bank Counter under a condition that the number of the first refresh commands Same Bank CMD is less than n, or generate the second clock signal based on the counting reset signal Bank Counter Reset under a condition that the number of the first refresh commands Same Bank CMD is equal to n.

The refresh window signal generation circuit 120 includes n refresh window sub-signal generation circuits 121 and a refresh window sub-signal processing circuit 122. Each of the refresh window sub-signal generation circuits 121 is configured to receive the refresh window reset signal Refresh Window Reset, and sequentially receive the multiple first refresh commands Same Bank CMD correspondingly. The refresh window sub-signal generation circuits 121 are configured to sequentially output multiple refresh window sub-signals based on the first refresh commands Same Bank CMD and the refresh window reset signal Refresh Window Reset. The refresh window sub-signal processing circuit 122 is coupled to the n refresh window sub-signal generation circuits 121 and configured to sequentially receive the multiple refresh window sub-signals, perform a logical operation on the refresh window sub-signals, and output the refresh window signal Refresh Window.

Because the memory has at least the same bank refresh mode and an all bank refresh mode, the refresh address generation circuit provided in the embodiments of the present disclosure is further configured to output an all bank refresh address. On this basis, the refresh control circuit 100 is further configured to receive a second refresh command All Bank CMD to perform a second refresh operation (an all bank refresh operation). Each of the multiple refresh window sub-signal generation circuits 121 is further configured to simultaneously receive the second refresh command All Bank CMD and the refresh window reset signal Refresh Window Reset. Each of the refresh window sub-signal generation circuits 121 is configured to generate the same refresh window sub-signal based on the second refresh command All Bank CMD and the second refresh window reset signal Refresh Window Reset. The refresh window sub-signal processing circuit 122 is configured to receive the multiple refresh window sub-signals, perform a logical operation on the refresh window sub-signals, and output the refresh window signal Refresh Window.

The refresh control circuit 100 further includes a second pulse generation sub-circuit 130, an inner refresh window signal generation circuit 140, a refresh window reset signal generation circuit 170, an address command signal (SB 2nd ADDR CMD) generation circuit 150, a signal selection circuit 180, and an address flag signal (SB 2nd ADDR flag) generation circuit 160.

The second pulse generation sub-circuit 130 is coupled to the refresh window signal generation circuit 120 and configured to receive the refresh window signal Refresh Window and an address command signal SB 2nd ADDR CMD, generate a first pulse of a third clock signal when the first refresh operation or the second refresh operation starts, and output a second pulse of the third clock signal based on a first pulse of the address command signal SB 2nd ADDR CMD, to output the third clock signal.

The inner refresh window signal generation circuit 140 is configured to generate an inner refresh window signal Inner ACT Window based on the third clock signal. A first pulse of the inner refresh window signal Inner ACT Window is generated after the first pulse of the third clock signal and ends before the second pulse of the third clock signal is generated. A second pulse of the inner refresh window signal Inner ACT Window is generated after the second pulse of the third clock signal and ends before a pulse of the refresh window signal Refresh Window ends.

The address command signal SB 2nd ADDR CMD generation circuit 150 is coupled to the inner refresh window signal generation circuit 140. The address command signal SB 2nd ADDR CMD generation circuit 150 is configured to generate a first pulse and a second pulse of the address command signal SB 2nd ADDR CMD based on a valid level of a pre-charge signal Inner PRE CMD. The first pulse of the address command signal SB 2nd ADDR CMD is used to generate the second pulse of the inner refresh window signal and the second pulse of the third clock signal. The valid level of the pre-charge signal Inner PRE CMD is a valid level generated in response to a falling edge of the inner refresh window signal Inner ACT Window.

The refresh window reset signal generation circuit 170 is coupled to the address flag signal (SB 2nd ADDR flag) generation circuit 160 and the n refresh window sub-signal generation circuits 121. The refresh window reset signal generation circuit 170 receives the pre-charge signal Inner PRE CMD and is configured to generate a pulse of the refresh window reset signal Refresh Window Reset based on a falling edge of a second pulse of the pre-charge signal Inner PRE CMD.

The signal selection circuit 180 is coupled to the counting circuit 111, the first pulse generation sub-circuit 113, and the second pulse generation sub-circuit 130, and configured to output the first clock signal or the second clock signal based on the counting signal Bank Counter when the refresh control circuit 100 performs the first refresh operation, or output the third clock signal based on the counting signal Bank Counter when the refresh control circuit 100 performs the second refresh operation. The address flag signal (SB 2nd ADDR flag) generation circuit 160 is coupled to the address command signal (SB 2nd ADDR CMD) generation circuit 150. The address flag signal (SB 2nd ADDR flag) generation circuit 160 is configured to generate a rising edge of an address flag signal SB 2nd ADDR flag based on a first rising edge of the address command signal SB 2nd ADDR CMD and generate a falling edge of the address flag signal SB 2nd ADDR flag based on a falling edge of the refresh window signal Refresh Window.

The address generator 200 includes an address counter 210 and an address processing circuit 220. The address counter 210 pre-stores the first address, is coupled to the signal selection circuit 180, and is configured to: change the first address to a third address based on the second clock signal, or change the first address based on the third clock signal and sequentially output a fourth address and a fifth address. The first address, the fourth address, and the fifth address are three consecutive addresses. The address processing circuit 220 is connected to the address counter 210 and the refresh window sub-signal generation circuits 121, and configured to receive the address flag signal SB 2nd ADDR flag when the refresh control circuit 100 performs the first refresh operation, obtain the first address, and output the first address before the rising edge of the address flag signal SB 2nd ADDR flag arrives, or output a second address after the rising edge of the address flag signal SB 2nd ADDR flag arrives. The address processing circuit 220 is further configured to: when the refresh control circuit 100 performs the second refresh operation, sequentially obtain the fourth address and the fifth address and sequentially output the fourth address and the fifth address based on the multiple refresh window sub-signals.

The address processing circuit 220 includes an address operation circuit 221 and an address selection circuit 222. The address operation circuit 221 is coupled to the address counter 210. The address operation circuit is configured to perform an addition operation or a subtraction operation on the first address to obtain the second address. The address selection circuit 222 is coupled to the address counter 210, the address operation circuit 221, and the refresh window sub-signal generation circuits 121, and configured to: when the first refresh commands Same Bank CMD are received, output the first address under a condition that the address flag signal SB 2nd ADDR flag is at a low level or output the second address under a condition that the address flag signal SB 2nd ADDR flag is at a high level; or when the second refresh command All Bank CMDs are received, sequentially output the fourth address and the third address based on the multiple refresh window sub-signals.

The counting circuit 111 includes n first inverters PI1 and n first latches RS1. Each of the first inverters PI1 correspondingly receives one of the first refresh commands Same Bank CMD. Set terminals of the n first latches RS1 are respectively connected to one of the first inverters PI1. Reset terminals of the n first latches RS1 are configured to receive the counting reset signal Bank Counter Reset. Output terminals of the n first latches RS1 are configured to output the counting signal Bank Counter. The n first latches RS1 are reset based on the counting reset signal Bank Counter Reset under a condition that the number of the first refresh operations is equal to the preset value.

The first latches RS1 may be RS latches. The n first latches RS1 are connected in parallel. The first refresh commands Same Bank CMD may be output through a refresh command output circuit. The refresh command output circuit may have n output terminals. Each output terminal outputs one first refresh command Same Bank CMD. The set terminal of each first latch RS1 is connected to one of the output terminals of the refresh command output circuit through one of the first inverters PI1. The output terminal of the first latch RS1 is an output terminal corresponding to the set terminal of the first latch RS1.

For example, the first refresh command Same Bank CMD may be a high-level pulse signal, and the first refresh command Same Bank CMD is converted to a low-level signal after passing through the first inverter PI1. The low-level signal is transmitted to the corresponding first latch RS1.

For example, the refresh command output circuit outputs the first refresh command Same Bank CMD to the first first latch RS1 at a moment t1, and outputs the first refresh command Same Bank CMD to the second first latch RS1 at a moment t2, until the refresh command output circuit outputs the first refresh command Same Bank CMD to the n-th first latch RS1 at a moment tN. When receiving a trigger edge of the first refresh command Same Bank CMD, the first latch RS1 outputs the counting signal Bank Counter. The n first latches RS1 sequentially receive the first refresh command Same Bank CMD and sequentially output the counting signal Bank Counter. For example, the first latch RS1 outputs a high-level signal after receiving the corresponding first refresh command Same Bank CMD.

The counting reset signal generation circuit 112 includes a first AND gate AG1, a second inverter PI2, a second AND gate AG2, a first delayer D1, a third inverter PI3, a third AND gate AG3, and a fourth inverter PI4. An input terminal of the first AND gate AG1 receives the counting signal Bank Counter. An input terminal of the second inverter PI2 is connected to the refresh window signal generation circuit 120 to invert the refresh window signal Refresh Window. The input terminals of the second AND gate AG2 are respectively connected to an output terminal of the first AND gate AG1 and an output terminal of the second inverter PI2. An input terminal of the first delayer D1 is connected to an output terminal of the second AND gate AG2. An input terminal of the third inverter PI3 is connected to an output terminal of the first delayer D1. The input terminals of the third AND gate AG3 are respectively connected to an output terminal of the second AND gate AG2 and an output terminal of the third inverter PI3. The fourth inverter PI4 is connected to an output terminal of the third AND gate AG3 to output the counting reset signal Bank Counter Reset.

The first AND gate AG1 may have n input terminals. Each input terminal of the first AND gate AG1 is correspondingly connected to one of the first latches RS1. The first AND gate AG1 performs an AND operation on the counting signals Bank Counter outputted by the n first latches RS1. For example, when the n first latches RS1 output the counting signals Bank Counter (high-level signals), the first AND gate AG1 outputs a high-level signal.

The input terminal of the second inverter PI2 is connected to an output terminal of the refresh window signal generation circuit 120. The refresh window signal generation circuit 120 outputs the refresh window signal Refresh Window. The second inverter PI2 is configured to invert the refresh window signal Refresh Window. The second AND gate AG2 has two input terminals. The two input terminals of the second AND gate AG2 are respectively connected to the output terminal of the first AND gate AG1 and the output terminal of the second inverter PI2.

The first delayer D1 delays a signal outputted by the second AND gate AG2 for a first preset time. The third inverter PI3 inverts a signal outputted by the first delayer D1. The third AND gate AG3 respectively receives the signal outputted by the second AND gate AG2 and a signal outputted by the third inverter PI3. The third AND gate AG3 performs an AND operation on these two signals to form a first pulse signal.

An input terminal of the fourth inverter PI4 is connected to the third AND gate AG3. An output terminal of the fourth inverter PI4 outputs the counting reset signal Bank Counter Reset. In other words, the first pulse signal is transmitted to the fourth inverter PI4. The first pulse signal passes through the fourth inverter PI4 to obtain the counting reset signal Bank Counter Reset. The output terminal of the fourth inverter PI4 is connected to the reset terminal of the first latch RS1. The output terminal of the first latch RS1 is reset when the first latch RS1 receives a trigger edge of the counting reset signal Bank Counter Reset.

For example, the counting reset signal Bank Counter Reset is output as a low-level signal at a moment t5. At this moment, the reset terminal of the first latch RS1 receives the low-level signal, and the set terminal of the first latch RS1 receives a high-level signal. Therefore, after the moment t5, the output terminal of the first latch RS1 outputs the low-level signal to reset the output terminal.

The first pulse generation sub-circuit 113 includes a second delayer D2, a third delayer D3, and a first OR gate OG1. An input terminal of the second delayer D2 is connected to the output terminal of the third AND gate AG3. An input terminal of the third delayer D3 is connected to an output terminal of the second delayer D2. The input terminals of the first OR gate OG1 are respectively connected to the output terminal of the third AND gate AG3 and an output terminal of the third delayer D3. An output terminal of the first OR gate OG1 outputs the first clock signal based on the counting signal Bank Counter under a condition that the number of the first refresh commands Same Bank CMD is less than n, or outputs the second clock signal based on the counting reset signal Bank Counter Reset under a condition that the number of the first refresh commands Same Bank CMD is equal to n.

The second delayer D2 is connected to the output terminal of the third AND gate AG3. The first pulse signal is delayed for a second preset time after passing through the second delayer D2 to obtain a second pulse signal. The second pulse signal is respectively transmitted to the third delayer D3 and the first OR gate OG1. The second pulse signal passes through the third delayer D3 to obtain a third pulse signal. The third pulse signal is transmitted to the first OR gate OG1. An OR operation is performed on the second pulse signal and the third pulse signal to obtain the second clock signal.

The address command signal (SB 2nd ADDR CMD) generation circuit 150 includes a fifth inverter PI5, a fourth delayer D4, and a fourth AND gate AG4. An input terminal of the fifth inverter PI5 receives the pre-charge signal Inner PRE CMD. An input terminal of the fourth delayer D4 is connected to an output terminal of the fifth inverter PI5. The input terminals of the fourth AND gate AG4 are respectively connected to the output terminal of the fifth inverter PI5 and an output terminal of the fourth delayer D4, to output the address command signal SB 2nd ADDR CMD.

The inner refresh window signal Inner ACT Window may be determined by the inner refresh window signal generation circuit 140. For example, the inner refresh window signal generation circuit 140 generates the inner refresh window signal Inner ACT Window. The inner refresh window signal Inner ACT Window is transmitted to a bank control circuit 300. The bank control circuit 300 generates the pre-charge signal Inner PRE CMD in response to the inner refresh window signal Inner ACT Window. The bank control circuit 300 refreshes a bank based on the inner refresh window signal Inner ACT Window and the to-be-refreshed address. The inner refresh window signal Inner ACT Window has two pulses. The pre-charge signal Inner PRE CMD is formed at the falling edge of the two pulse signals of the inner refresh window signal Inner ACT Window. The pre-charge signal Inner PRE CMD is inverted by the fifth inverter PI5, and delayed by the fourth delayer D4 for a fourth preset time. The two signals pass through the fourth AND gate AG4 to obtain the first pulse and the second pulse of the address command signal SB $2^{nd}$ ADDR CMD.

The address flag signal (SB 2nd ADDR flag) generation circuit 160 includes a sixth inverter PI6 and a second latch RS2. An input terminal of the sixth inverter PI6 is connected to an output terminal of the fourth AND gate AG4. A set terminal of the second latch RS2 is connected to an output terminal of the sixth inverter PI6. The second latch RS2 outputs the address flag signal SB 2nd ADDR flag.

The sixth inverter PI6 receives the address command signal SB 2nd ADDR CMD. The sixth inverter PI6 inverts the address command signal SB 2nd ADDR CMD. An inverted address command signal SB 2nd ADDR CMD is transmitted to the set terminal of the second latch RS2. A reset terminal of the second latch RS2 receives the refresh window signal Refresh Window. The second latch RS2 outputs the address flag signal SB 2nd ADDR flag when a trigger edge of the inverted address command signal SB 2nd ADDR CMD arrives, and is reset when a trigger edge of the refresh window signal Refresh Window arrives.

The refresh window reset signal generation circuit 170 includes a fifth AND gate AG5, a sixth delayer D6, and a tenth inverter PI10. Input terminals of the fifth AND gate AG5 respectively receive the signal outputted by the second latch RS2 and the pre-charge signal Inner PRE CMD. An intermediate pulse signal is generated based on the falling edge of the second pulse of the pre-charge signal Inner PRE CMD. An input terminal of the sixth delayer D6 is connected to an output terminal of the fifth AND gate AG5. The tenth inverter PI10 is connected to an output terminal of the sixth delayer D6. The intermediate pulse signal passes through the sixth delayer D6 and the tenth inverter PI10 to generate the pulse of the refresh window reset signal Refresh Window Reset.

A fifth delayer D5 may be further disposed between the fifth AND gate AG5 and the second latch RS2. The fifth delayer D5 is configured to delay the address flag signal SB 2nd ADDR flag for a fifth preset time.

The refresh window sub-signal generation circuit 121 includes a first NOR gate NOG1 and a third latch RS3. The input terminals of the first NOR gate NOG1 respectively receive the first refresh command Same Bank CMD and the second refresh command All Bank CMD. A set terminal of the third latch RS3 is connected to an output terminal of the first NOR gate NOG1. A reset terminal of the third latch RS3 is connected to an output terminal of the tenth inverter PI10. An output terminal of the third latch RS3 outputs the refresh window sub-signal.

When the first NOR gate NOG1 receives the first refresh command Same Bank CMD, the third latch RS3 outputs the refresh window sub-signal based on a signal outputted by the first NOR gate NOG1 in response to the first refresh command Same Bank CMD and the refresh window reset signal Refresh Window Reset.

The refresh window sub-signal processing circuit 122 includes a third OR gate Input terminals of the third OR gate OG3 are respectively connected to output terminals of multiple third latches RS3 to output the refresh window signal Refresh Window.

The third OR gate OG3 includes n input terminals, the n input terminals are respectively connected with a third latches RS3. When any input terminal of the third OR gate OG3 receives the refresh window sub-signal, the third OR gate OG3 outputs a valid level of the refresh window signal Refresh Window.

The second pulse generation sub-circuit 130 includes a seventh delayer D7, a seventh inverter PI7, a sixth AND gate AG6, an eighth inverter PI8, a seventh AND gate AG7, a second NOR gate NOG2, and a ninth inverter PI9. An input terminal of the seventh delayer D7 is connected to the refresh window signal generation circuit 120 to receive the refresh window signal Refresh Window. An input terminal of the seventh inverter PI7 is connected to an output terminal of the seventh delayer D7. The input terminals of the sixth AND gate AG6 are respectively connected to the refresh window signal generation circuit 120 and an output terminal of the seventh inverter PI7. An input terminal of the eighth inverter PI8 is connected to the address flag signal (SB 2nd ADDR flag) generation circuit 160. The input terminals of the seventh AND gate AG7 are respectively connected to an output terminal of the eighth inverter PI8 and the address command signal (SB 2nd ADDR CMD) generation circuit 150. The input terminals of the second NOR gate NOG2 are respectively connected to an output terminal of the sixth AND gate AG6 and an output terminal of the seventh AND gate AG7. An input terminal of the ninth inverter PI9 is connected to an output terminal of the second NOR gate NOG2. An output terminal of the ninth inverter PI9 is connected to the signal selection circuit 180.

The refresh window signal Refresh Window is transmitted to the seventh delayer D7 and the sixth AND gate AG6. The seventh delayer D7 delays the refresh window signal Refresh Window for a seventh preset time. The seventh inverter PI7 inverts a delayed refresh window signal Refresh Window. A signal outputted by the seventh inverter PI7 and the refresh window signal Refresh Window pass through the sixth AND gate AG6 to obtain a fifth pulse signal Inner 1st ACT CMD. The eighth inverter PI8 receives and inverts a signal outputted by the fifth delayer D5. The seventh AND gate AG7 receives the signal outputted by the eighth inverter PI8 and the address command signal SB 2nd ADDR CMD outputted by the fourth AND gate AG4 to form a sixth pulse signal. The fifth pulse signal Inner 1st ACT CMD and the sixth pulse signal pass through the second NOR gate NOG2 to obtain a seventh pulse signal. The seventh pulse signal passes through the ninth inverter PI9 to form the third clock signal.

The inner refresh window signal generation circuit 140 includes a fourth latch RS4. A set terminal of the fourth latch RS4 is connected to the output terminal of the second NOR gate NOG2. A reset terminal of the fourth latch RS4 is connected to the address command signal (SB 2nd ADDR CMD) generation circuit 150. The inner refresh window signal Inner ACT Window is generated based on the third clock signal.

The signal selection circuit 180 includes a third NOR gate NOG3, a second OR gate OG2, and an eighth AND gate AG8. An input terminal of the third NOR gate NOG3 receives the counting signal Bank Counter. The input terminals of the second OR gate OG2 are respectively connected to the first pulse generation sub-circuit and the second pulse generation sub-circuit. The input terminals of the eighth AND gate AG8 are respectively connected to an output terminal of the third NOR gate NOG3 and an output terminal of the second OR gate OG2. An output terminal of the eighth AND gate AG8 is connected to the address generator 200.

Each input terminal of the third NOR gate NOG3 is connected to the output terminal of one of the n first latches RS1. The third NOR gate NOG3 receives the signals outputted by the n first latches RS1. In the same bank refresh mode, the third NOR gate NOG3 outputs a valid signal in response to the counting signal Bank Counter after the counting circuit 111 receives the preset value of first refresh commands Same Bank CMD. In the all bank refresh mode, the n first latch units output low-level signals, and the third NOR gate NOG3 continuously outputs a valid signal. The input terminals of the second OR gate OG2 are respectively connected to the output terminal of the first OR gate OG1 and the output terminal of the ninth inverter PI9. The input terminals of the eighth AND gate AG8 are respectively connected to the output terminal of the third NOR gate NOG3 and the output terminal of the second OR gate OG2. The eighth AND gate AG8 shields the third clock signal in the same bank refresh mode. In other words, in the same bank refresh mode, the eighth AND gate AG8 shields the signal outputted by the second pulse generation sub-circuit 130, and outputs the first clock signal or the second clock signal to the address generator 200 based on the counting signal Bank Counter.

The address counter 210 is connected to the eighth AND gate AG8. When the memory works in the same bank refresh mode, the address counter 210 maintains its output address (the first address) in response to the first clock signal, and changes its output address (to the third address) in response to the second clock signal. When the memory works in the all bank refresh mode, the address counter 210 changes its output address (to the fourth address and the fifth address) in response to the third clock signal.

The address selection circuit 222 includes a ninth AND gate AG9, an eleventh inverter PI11, a fourth NOR gate NOG4, and a multiplexer 21. Each input terminal of the ninth AND gate AG9 is connected to one of the multiple refresh window sub-signal generation circuits 121. An input terminal of the eleventh inverter PI11 is connected to the address flag signal generation circuit to receive the address flag signal. The input terminals of the fourth NOR gate NOG4 are respectively connected to an output terminal of the ninth AND gate AG9 and an output terminal of the eleventh inverter PI11. The multiplexer 21 is connected to the address counter 210, the address operation circuit 221, and the fourth NOR gate NOG4, and configured to: when the first refresh operation is performed, output the first address or the second address (output the first address at a first rising edge of the address flag signal or output the second address at a second rising edge of the address flag signal) in response to a signal outputted by the fourth NOR gate NOG4; or when the second refresh operation is performed, output the fourth address or the fifth address (sequentially output the fourth address and the fifth address once at the rising edge of each refresh window sub-signal).

The address operation circuit 221 may include an adder. The adder is connected to the address counter 210 and the address selection circuit 222. The adder is configured to perform an addition operation on an address n outputted by the address counter 210 to obtain an address n+1, and transmit an operation result to the address selection circuit 222. Alternatively, the address operation circuit 221 may include a subtracter. The subtracter is connected to the address counter 210 and the address selection circuit 222. The subtracter is configured to perform a subtraction operation on an address n outputted by the address counter 210 to obtain an address n−1, and transmit an operation result to the address selection circuit 222.

In the embodiments of the present disclosure, the first preset time of the first delayer D1 may be 1 nanosecond, the second preset time of the second delayer D2 may be 2 nanoseconds, the third preset time of the third delayer D3 may be 5 nanoseconds, the fourth preset time of the fourth delayer D4 may be 1 nanosecond, the fifth preset time of the fifth delayer D5 may be 1 nanosecond, the sixth preset time of the sixth delayer D6 may be 5 nanoseconds, and the seventh preset time of the seventh delayer D7 may be 2 nanoseconds. Certainly, in practical application, the delay time of each delayer may alternatively be another time determined based on a timing sequence of the refresh address generation circuit. The embodiments of the present disclosure are not limited thereto.

Figure 6:
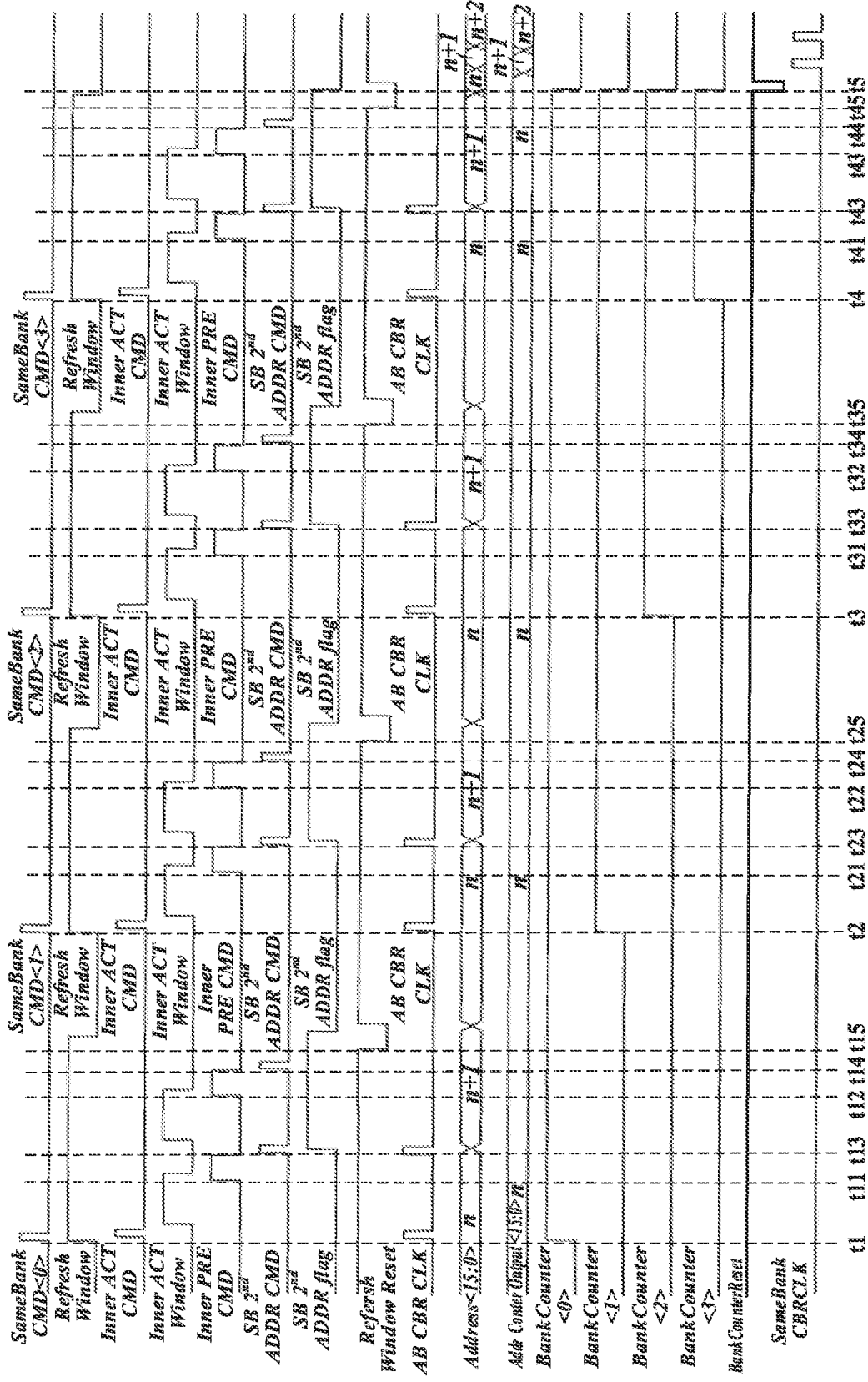
FIG. 6 is a signal timing sequence diagram of a refresh address generation circuit according to an exemplary embodiment of the present disclosure.

The following uses an example in which N is 4 to describe the refresh address generation circuit provided in the embodiments of the present disclosure with reference to a timing sequence diagram illustrated in FIG. 6. Waveforms of 4 cycles are shown for all signals except the first refresh command Same Bank CMD, the counting signal Bank Counter, the counting reset signal Bank Counter Reset, and the same bank refresh clock signal Same Bank CBR CLK. If the waveform of each cycle includes two valid pulses, the valid pulse at the front of the timing sequence is the first pulse, and the valid pulse at the back of the timing sequence is the second pulse. The signal waveforms in the subsequent accompanying drawings are also divided based on similar rules. Details are not described again hereinafter.

In the same bank refresh mode, as illustrated in FIG. 6, the counting circuit 111 and the refresh window signal generation circuit 120 sequentially receive first refresh commands Same Bank CMD<0>, Same Bank CMD<1>, Same Bank CMD<2>, and Same Bank CMD<3> at moments t1, t2, t3, and t4. The inner refresh window signal generation circuit 140 outputs the inner refresh window signal Inner ACT Window. The inner refresh window signal Inner ACT Window has falling edges at moments t11, t12, t21, t22, t31, t32, t41, and t42. t11 and t12 are between t1 and t2. t21 and t22 are between t2 and t3. t31 and t32 are between t3 and t4. t41 and t42 are after t4.

The first first latch RS1 outputs a counting signal Bank Counter<0> after the moment t1 in response to an inverted first refresh command Same Bank CMD<0>. The second first latch RS1 outputs a counting signal Bank Counter<1> after the moment t2 in response to an inverted first refresh command Same Bank CMD<1>. The third first latch RS1 outputs a counting signal Bank Counter<2> after the moment t3 in response to an inverted first refresh command Same Bank CMD<2>. The fourth first latch RS1 outputs a counting signal Bank Counter<3> after the moment t4 in response to an inverted first refresh command Same Bank CMD<3>.

The first third latch RS3 outputs a refresh window sub-signal SBREF_WIN<0> in response to the inverted first refresh command Same Bank CMD<0>. The second third latch RS3 outputs a refresh window sub-signal SBREF_WIN<1> in response to the inverted first refresh command Same Bank CMD<1>. The third third latch RS3 outputs a refresh window sub-signal SBREF_WIN<2> in response to the inverted first refresh command Same Bank CMD<2>. The fourth third latch RS3 outputs a refresh window sub-signal SBREF_WIN<3> in response to the inverted first refresh command Same Bank CMD<3>. In addition, the third latch RS3 is reset in response to the refresh window reset signal Refresh Window Reset.

After the pre-charge signal Inner PRE CMD passes through the fifth inverter PI5, the fourth delayer D4, and the fourth AND gate AG4, the address command signal SB 2nd ADDR CMD is generated at moments t13, t14, t23, t24, t33, t34, t43, and t44. The address command signal SB 2nd ADDR CMD passes through the sixth inverter PI6 and the second latch RS2 to generate the address flag signal SB 2nd ADDR flag. The address flag signal SB 2nd ADDR flag is transmitted to the fifth AND gate AG5 through the fifth delayer D5. The fifth AND gate AG5 receives a delayed address flag signal SB 2nd ADDR flag and the pre-charge signal Inner PRE CMD. A signal outputted by the fifth AND gate AG5 passes through the sixth delayer D6 and the tenth inverter PI10 to generate the refresh window reset signal Refresh Window Reset at moments t15, t25, t35, and t45.

The n refresh window sub-signal generation circuits 121 respectively receive Same Bank CMD<0>, Same Bank CMD<1>, Same Bank CMD<2>, and Same Bank CMD<3>, and sequentially output the refresh window sub-signals SBREF_WIN. The refresh window sub-signal processing circuit 122 sequentially receives the multiple refresh window sub-signals SBREF_WIN, performs a logical operation on the refresh window sub-signals SBREF_WIN, and outputs the refresh window signal Refresh Window at the moments t1, t2, t3, and t4.

The first AND gate AG1 receives the counting signals Bank Counter outputted by the 4 first latches RS1 and outputs a first intermediate signal at the moment t4. The second AND gate AG2 receives the first intermediate signal and an inverted refresh window signal Refresh Window and outputs a second intermediate signal. The second intermediate signal passes through the first delayer D1, the third inverter PI3, and the third AND gate AG3 to output the first pulse signal at the moment t5. The first pulse signal passes through the second delayer D2, the third delayer D3, and the first OR gate OG1 to generate the second clock signal. The second clock signal has two pulses. After the first pulse signal passes through the fourth inverter PI4, the counting reset signal Bank Counter Reset is outputted.

The second clock signal is transmitted to the address counter 210. The address counter 210 generates a new refresh address in response to the second clock signal. The address counter 210 may transition between two addresses when the second clock signal has two pulses. For example, addresses during previous same bank refreshing are 0000 and 0001, 0000 is outputted by the address counter 210, and 0001 is outputted by the address processing circuit 220. When receiving the second clock signal, the address counter 210 may transition from 0000 to 0010. For example, the first clock signal and the second clock signal may be Same Bank CBR CLK illustrated in FIG. 6. The first clock signal is at a low level, and the second clock signal is a pulse signal.

The third NOR gate NOG3 receives BankCounter<0>, BankCounter<1>, BankCounter<2>, and BankCounter<3>, and outputs a valid level after the moment t5. A signal outputted before the moment t5 can be shielded by the eighth AND gate AG8 and the third NOR gate NOG3. This prevents the refresh address from transitioning in advance in the same bank refresh mode, thereby maintaining the refresh address during same bank refreshing.

It should be noted that in the embodiments of the present disclosure, one refresh operation starts when the refresh control circuit 100 receives the first refresh command Same Bank CMD and ends when the refresh control circuit 100 outputs the counting reset signal Bank Counter Reset. In addition, when the refresh control circuit 100 outputs the counting reset signal Bank Counter Reset, it is determined that the number of refresh operations reaches the preset value.

In the all bank refresh mode, the signals received by the four input terminals of the counting circuit 111 are all low-level signals. In this case, the four first latches RS1 output low-level signals. The input terminals of the n refresh window sub-signal generation circuits 121 input the second refresh command All Bank CMD.

The refresh window signal Refresh Window passes through the seventh delayer D7, the seventh inverter PI7, and the sixth AND gate AG6 to output the fifth pulse signal Inner 1st ACT CMD at the moments t1, t2, t3, and t4. The address flag signal SB 2nd ADDR flag passes through the fifth delayer D5 and the eighth inverter PI8 to generate a third intermediate signal. The third intermediate signal and the address command signal SB 2nd ADDR CMD pass through the seventh AND gate AG7 to generate the sixth pulse signal at the moments t11, t21, t31, and t41. The sixth pulse signal and the fifth pulse signal Inner 1st ACT CMD pass through the second NOR gate NOG2 and the ninth inverter PI9 to generate the third clock signal.

In the same bank refresh mode, the third NOR gate NOG3 continuously outputs a high-level signal, and the first pulse generation sub-circuit 113 continuously outputs a low-level signal, such that the second OR gate OG2 outputs the third clock signal, and the eighth AND gate AG8 outputs the third clock signal. The third clock signal includes four group of pulse signals. Each group of pulse signals includes two pulses.

The third clock signal is transmitted to the address counter 210. The address counter 210 generates a new refresh address in response to the third clock signal. The address counter 210 may transition between two addresses when each group of the third clock signals has two pulses. For example, current refresh addresses are n (outputted by the address counter 210) and n+1 (outputted by the address processing circuit 220), the address counter changes the refresh addresses to n+2 (outputted by the address counter 210) and n+3 (outputted by the address processing circuit 220) in response to the third clock signal.

The refresh address generation circuit provided in the embodiments of the present disclosure includes the refresh control circuit 100 and the address generator 200. The refresh control circuit 100 is configured to sequentially receive the multiple first refresh commands Same Bank CMD, and perform the first refresh operations respectively; and output the first clock signal under a condition that the number of the first refresh operations is less than the preset value, or output the second clock signal under a condition that the number of the first refresh operations is equal to the preset value n. The address generator 200 is coupled to the refresh control circuit 100, pre-stores the first address, and receives the first clock signal or the second clock signal. During each first refresh operation, the address generator 200 outputs the first to-be-refreshed address in response to the first clock signal. The first to-be-refreshed address includes the first address. The address generator 200 changes the first address in response to the second clock signal such that the refresh address is provided to the memory in the same bank refresh mode. In addition, during same bank refreshing, when multiple banks do not completely refresh the current address, the address can be maintained, and an address transition during the refreshing is avoided. The refresh address generation circuit can also provide the refresh address in the all bank refresh mode to share the refresh address generation circuit and help reduce layout space and production costs of the memory.

Figure 7:
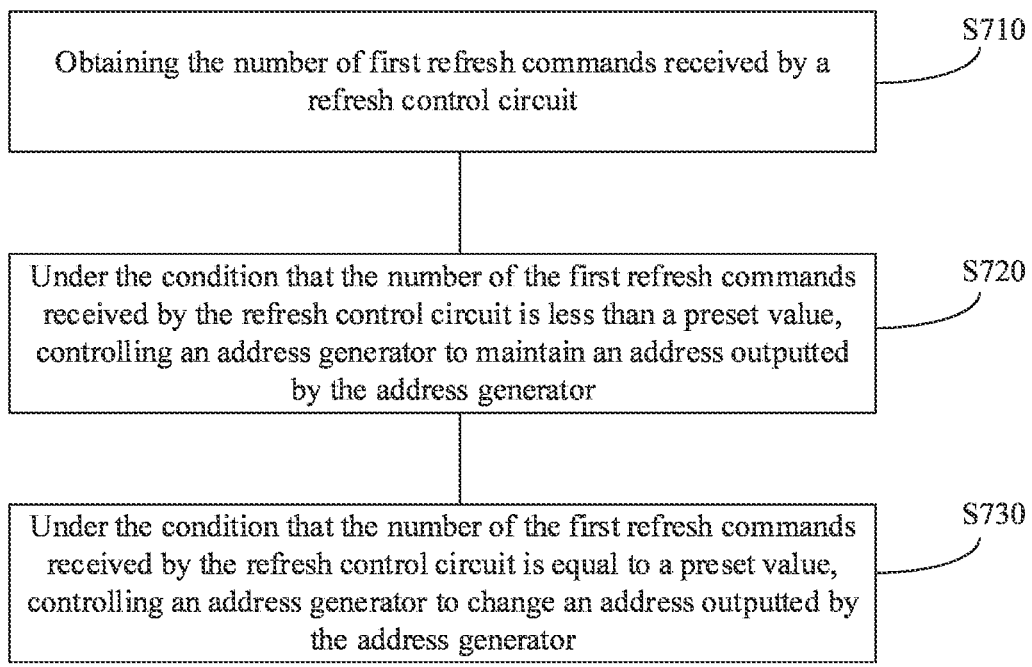
FIG. 7 is a flowchart of a first refresh address generation method according to an exemplary embodiment of the present disclosure.

The exemplary embodiments of the present disclosure further provide a refresh address generation method, applied to the foregoing circuit and used in a same bank refresh mode. As illustrated in FIG. 7, the refresh address generation method includes the following operations.

In S710, the number of first refresh operations performed by a refresh control circuit when the refresh control circuit receives first refresh commands is obtained.

In S720, under the condition that the number of the first refresh operations performed by the refresh control circuit is less than a preset value, an address generator is controlled to maintain an address outputted by the address generator.

In S730, under a condition that the number of the first refresh operations performed by the refresh control circuit is equal to the preset value, the address generator is controlled to change the address outputted by the address generator.

In the refresh address generation method provided in the embodiments of the present disclosure, the number of the first refresh commands Same Bank CMD received by the refresh control circuit 100 is obtained. Under a condition that the number of the first refresh operations performed by the refresh control circuit 100 is less than the preset value, the address generator 200 is controlled to maintain its output address. Under a condition that the number of the first refresh operations performed by the refresh control circuit 100 is equal to the preset value, the address generator 200 is controlled to change its output address. In addition, during same bank refreshing, when multiple banks do not completely refresh the current address, the address can be maintained, and an address transition during the refreshing is avoided. The refresh address generation circuit can also provide the refresh address in the all bank refresh mode to share the refresh address generation circuit and help reduce layout space and production costs of the memory.

Figure 8:
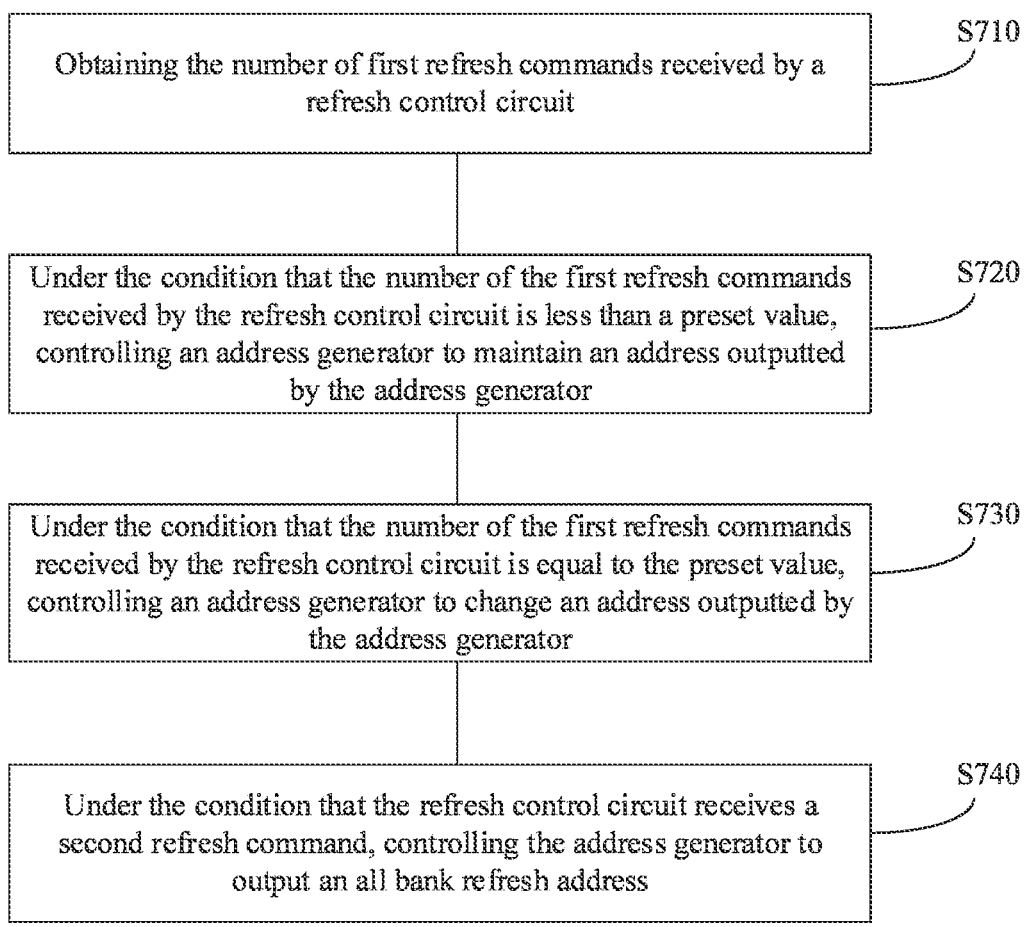
FIG. 8 is a flowchart of a second refresh address generation method according to an exemplary embodiment of the present disclosure.

As illustrated in FIG. 8, the refresh address generation method provided in the embodiments of the present disclosure may further include the following operation.

In S740, when the refresh control circuit receives a second refresh command, the address generator is controlled to output an all bank refresh address.

It should be noted that in the embodiments of the present disclosure, the implementation of the refresh address generation circuit has been described in detail in the circuit part. Details are not described herein again.

Each operation of the refresh address generation method provided in the embodiments of the present disclosure is described in detail below.

In S710, the number of the first refresh commands Same Bank CMD received by the refresh control circuit 100 may be obtained.

The first refresh commands may be counted through the counting circuit, the counting reset signal generation circuit, and the first pulse generation sub-circuit.

In the same bank refresh mode, as illustrated in FIG. 6, the counting circuit 111 and the refresh window signal generation circuit 120 sequentially receive first refresh commands Same Bank CMD<0>, Same Bank CMD<1>, Same Bank CMD<2>, and Same Bank CMD<3> at moments t1, t2, t3, and t4. The inner refresh window signal generation circuit 140 outputs the inner refresh window signal Inner ACT Window. The inner refresh window signal Inner ACT Window has falling edges at moments t11, t12, t21, t22, t31, t32, t41, and t42. t11 and t12 are between t1 and t2. t21 and t22 are between t2 and t3. t31 and t32 are between t3 and t4. t41 and t42 are after t4.

The first first latch RS1 outputs a counting signal Bank Counter<0> after the moment t1 in response to an inverted first refresh command Same Bank CMD<0>. The second first latch RS1 outputs a counting signal Bank Counter<1> after the moment t2 in response to an inverted first refresh command Same Bank CMD<1>. The third first latch RS1 outputs a counting signal BankCounter<2> after the moment t3 in response to an inverted first refresh command Same Bank CMD<2>. The fourth first latch RS1 outputs a counting signal Bank Counter<3> after the moment t4 in response to an inverted first refresh command Same Bank CMD<3>.

The first third latch RS3 outputs a refresh window sub-signal SBREF_WIN<0> in response to the inverted first refresh command Same Bank CMD<0>. The second third latch RS3 outputs a refresh window sub-signal SBREF_WIN<1> in response to the inverted first refresh command Same Bank CMD<1>. The third third latch RS3 outputs a refresh window sub-signal SBREF_WIN<2> in response to the inverted first refresh command Same Bank CMD<2>. The fourth third latch RS3 outputs a refresh window sub-signal SBREF_WIN<3> in response to the inverted first refresh command Same Bank CMD<3>. In addition, the third latch RS3 is reset in response to the refresh window reset signal Refresh Window Reset.

After the pre-charge signal Inner PRE CMD passes through the fifth inverter PI5, the fourth delayer D4, and the fourth AND gate AG4, the address command signal SB 2nd ADDR CMD is generated at moments t13, t14, t23, t24, t33, t34, t43, and t44. The address command signal SB 2nd ADDR CMD passes through the sixth inverter PI6 and the second latch RS2 to generate the address flag signal SB 2nd ADDR flag. The address flag signal SB 2nd ADDR flag is transmitted to the fifth AND gate AG5 through the fifth delayer D5. The fifth AND gate AG5 receives a delayed address flag signal SB 2nd ADDR flag and the pre-charge signal Inner PRE CMD. A signal outputted by the fifth AND gate AG5 passes through the sixth delayer D6 and the tenth inverter PI10 to generate the refresh window reset signal Refresh Window Reset at moments t15, t25, t35, and t45.

The n refresh window sub-signal generation circuits 121 respectively receive Same Bank CMD<0>, Same Bank CMD<1>, Same Bank CMD<2>, and Same Bank CMD<3>, and sequentially output the refresh window sub-signals SBREF_WIN. The refresh window sub-signal processing circuit 122 sequentially receives the multiple refresh window sub-signals SBREF_WIN, performs a logical operation on the refresh window sub-signals SBREF_WIN, and outputs the refresh window signal Refresh Window at the moments t1, t2, t3, and t4.

The first AND gate AG1 receives the counting signals Bank Counter outputted by the 4 first latches RS1, and outputs a first intermediate signal at the moment t4. The second AND gate AG2 receives the first intermediate signal and an inverted refresh window signal Refresh Window, and outputs a second intermediate signal. The second intermediate signal passes through the first delayer D1, the third inverter PI3, and the third AND gate AG3 to output the first pulse signal at the moment t5. The first pulse signal passes through the second delayer D2, the third delayer D3, and the first OR gate OG1 to generate the second clock signal. The second clock signal has two pulses. After the first pulse signal passes through the fourth inverter PI4, the counting reset signal Bank Counter Reset is outputted.

The second clock signal is transmitted to the address counter 210. The address counter 210 generates a new refresh address in response to the second clock signal. The address counter 210 may transition between two addresses when the second clock signal has two pulses. For example, addresses during previous same bank refreshing are 0000 and 0001, 0000 is outputted by the address counter 210, and 0001 is output by the address processing circuit 220. During current same bank refreshing, the address counter 210 may transition from 0000 to 0010. For example, the first clock signal and the second clock signal may be Same Bank CBR CLK illustrated in FIG. 6. The first clock signal is at a low level, and the second clock signal is at a high level.

In S720, under a condition that the number of the first refresh commands received by the refresh control circuit is less than the preset value, the address generator is controlled to maintain the address outputted by the address generator.

Under a condition that the number of the first refresh commands received by the refresh control circuit is less than the preset value, the address outputted by the address generator is maintained through the address counter and the address processing circuit.

For example, under a condition that the number of the first refresh commands is less than 4, the refresh control circuit outputs the first clock signal (low-level signal). The address counter keeps a signal output to the address processing circuit unchanged in response to the first clock signal such that an address outputted by the address processing circuit is unchanged.

In S730, under a condition that the number of the first refresh commands received by the refresh control circuit 100 is equal to the preset value, the address generator 200 is controlled to change its output address.

Under a condition that the number of the first refresh commands received by the refresh control circuit is equal to the preset value, the address output by the address generator is changed through the address counter and the address processing circuit.

For example, under a condition that the number of the first refresh commands is less than 4, the refresh control circuit 100 outputs the second clock signal (at least one high-level signal). The second clock signal is transmitted to the address counter. The address counter generates a new refresh address in response to the second clock signal. The address counter may transition between two addresses when the second clock signal has two pulses. For example, addresses during previous same bank refreshing are 0000 and 0001, 0000 is outputted by the address counter, and 0001 is outputted by the address processing circuit. During current same bank refreshing, the address counter may transition from 0000 to 0010.

The third NOR gate receives BankCounter<0>, BankCounter<1>, BankCounter<2>, and BankCounter<3>, and outputs a valid level after the moment t5. A signal outputted before the moment t5 can be shielded by the eighth AND gate and the third NOR gate. This prevents the refresh address from transitioning in advance in the same bank refresh mode, thereby maintaining the refresh address during same bank refreshing.

In S740, when the refresh control circuit 100 receives the second refresh command All Bank CMD, the address generator 200 is controlled to change its output address.

In the all bank refresh mode, the signals received by the four input terminals of the counting circuit 111 are all low-level signals. In this case, the four first latches RS1 output low-level signals. The input terminals of the n refresh window sub-signal generation circuits 121 input the second refresh command All Bank CMD.

The refresh window signal Refresh Window passes through the seventh delayer D7, the seventh inverter PI7, and the sixth AND gate AG6 to output the fifth pulse signal Inner 1st ACT CMD at the moments t1, t2, t3, and t4. The address flag signal SB 2nd ADDR flag passes through the fifth delayer D5 and the eighth inverter PI8 to generate a third intermediate signal. The third intermediate signal and the address command signal SB 2nd ADDR CMD pass through the seventh AND gate AG7 to generate the sixth pulse signal at the moments t11, t21, t31, and t41. The sixth pulse signal and the fifth pulse signal Inner 1st ACT CMD pass through the second NOR gate NOG2 and the ninth inverter PI9 to generate the third clock signal.

The third clock signal is transmitted to the address counter. The address counter generates a new refresh address in response to the third clock signal. The address counter may transition between two addresses when each group of the third clock signal has two pulses. For example, addresses during previous all bank refreshing are 0000 and 0001, 0000 is outputted by the address counter, and 0001 is outputted by the address processing circuit. During current all bank refreshing, the address counter may transition from 0000 to 0010.

In the refresh address generation method provided in the embodiments of the present disclosure, the number of the first refresh operations performed by the refresh control circuit 100 is obtained. Under a condition that the number of the first refresh operation is less than the preset value, the first clock signal is output. Under a condition that the number of the first refresh operations is equal to the preset value, the second clock signal is output. The address generator 200 outputs a to-be-refreshed address based on the first clock signal, and changes the first address based on the second clock signal. The refresh address is provided to the memory in the same bank refresh mode. In addition, during same bank refreshing, when multiple banks do not completely refresh current address, the address can be maintained, and an address transition during the refreshing is avoided. The refresh address generation circuit can also provide the refresh address in the all bank refresh mode to share the refresh address generation circuit and help reduce layout space and production costs of the memory.

The exemplary embodiments of the present disclosure further provide a memory. The memory includes the foregoing refresh address generation circuit.

The refresh address generation circuit includes the refresh control circuit 100 and the address generator 200. The refresh control circuit 100 is configured to sequentially receive the multiple first refresh commands Same Bank CMD, and perform the first refresh operations respectively, and output the first clock signal under a condition that the number of the first refresh operations is less than the preset value or output the second clock signal under a condition that the number of the first refresh operations is equal to the preset value n, where n is a positive integer greater than or equal to 1. The address generator 200 is coupled to the refresh control circuit 100, pre-stores the first address, and receives the first clock signal or the second clock signal. The address generator 200 outputs the first to-be-refreshed address in response to the first clock signal. The first to-be-refreshed address includes the first address. After outputting the first to-be-refreshed address, the address generator 200 changes the first address in response to the second clock signal.

The memory provided in the embodiments of the present disclosure may further include a memory cell array. The memory cell array is configured to store data. The memory cell array may be connected to a control module 140. The control module 140 is configured to control data writing of memory cells in the memory cell array. A refresh address of the memory cell may be provided by the refresh address generation circuit provided in the embodiments of the present disclosure.

The memory has a same bank refresh mode and an all bank refresh mode. In the same bank refresh mode, a same address in multiple banks in the memory is sequentially refreshed. For example, for an address 0000 in N banks, 0000 of each bank is sequentially refreshed during refreshing. In the all bank refresh mode, a same address in multiple banks in the memory is simultaneously refreshed. For example, for the address 0000 in N banks, 0000 of each bank is simultaneously refreshed during refreshing.

The memory provided in the embodiments of the present disclosure may be a DDR5 SDRAM. Certainly, in practical application, the memory may alternatively be another memory, for example, a DDR6 SDRAM or a DDR4 SDRAM. The embodiments of the present disclosure are not limited thereto.

The memory provided in the embodiments of the present disclosure includes the refresh address generation circuit. In the refresh address generation circuit, the refresh control circuit 100 is connected to the address generator 200. The refresh control circuit 100 receives the first refresh commands Same Bank CMD and perform the first refresh operations, and is configured to output the first clock signal under a condition that the number of the first refresh operations is less than the preset value or output the second clock signal under a condition that the number of the first refresh operations is equal to the preset value. The address generator 200 maintains its output address based on the first clock signal, and changes its output address based on the second clock signal such that the refresh address is provided to the memory in the same bank refresh mode. In addition, during same bank refreshing, when multiple banks do not completely refresh the current address, the address can be maintained, and an address transition during the refreshing is avoided. The refresh address generation circuit can also provide the refresh address in the all bank refresh mode to share the refresh address generation circuit and help reduce layout space and production costs of the memory.

The exemplary embodiments of the present disclosure further provide an electronic device. The electronic device includes the foregoing memory. The electronic device may be a mobile phone, a tablet computer, a personal computer, a server, a smartwatch, smart glasses, a personal digital assistant, a vehicle-mounted computer, or the like.

Those skilled in the art can readily figure out other embodiments of the present disclosure after considering the specification and practicing the content disclosed herein. The present disclosure is intended to cover any variations, purposes, or adaptive changes of the present disclosure. Such variations, purposes, or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the claims.

It should be noted that the present disclosure is not limited to the precise structures described above and shown in the accompanying drawings, and can be modified and changed in many ways without departing from the scope of the present disclosure. The scope of the present disclosure is defined by the appended claims.

What is claimed is:

1. A refresh address generation circuit, comprising:
    a refresh control circuit, configured to sequentially receive a plurality of first refresh commands, and perform first refresh operations respectively; and further configured to: under a condition that a number of the first refresh operations is less than a preset value, output a first clock signal; and under a condition that the number of the first refresh operations is equal to the preset value n, output a second clock signal, wherein n is a positive integer greater than or equal to 1; and
    an address generator, coupled to the refresh control circuit, and configured to pre-store a first address and to receive the first clock signal or the second clock signal, wherein the address generator is further configured to: output a first to-be-refreshed address in response to the first clock signal during each of the first refresh operations, wherein the first to-be-refreshed address comprises the first address; and change the first address in response to the second clock signal.

2. The refresh address generation circuit of claim 1, wherein the refresh control circuit comprises:
    a refresh window signal generation circuit, configured to receive the plurality of first refresh commands and a refresh window reset signal, and to generate a refresh window signal based on the plurality of first refresh commands and the refresh window reset signal, wherein a pulse duration of the refresh window signal is a window duration for the refresh control circuit to perform one refresh operation, and the refresh window reset signal is used to reset the refresh window signal generation circuit after one refresh operation ends; and
    a clock pulse generation circuit, coupled to the refresh window signal generation circuit, and configured to: under a condition that the number of the plurality of first refresh commands received by the clock pulse generation circuit is less than or equal to n, generate the first clock signal before an n-th first refresh operation ends; or under a condition that the number of the plurality of first refresh commands received by the clock pulse generation circuit is n, generate the second clock signal after an n-th first refresh operation ends.

3. The refresh address generation circuit of claim 2, wherein the clock pulse generation circuit comprises:
a counting circuit, configured to receive the plurality of first refresh commands and a counting reset signal, and to count the plurality of first refresh commands and output a counting signal, wherein the counting circuit is reset based on the counting reset signal;
a counting reset signal generation circuit, coupled to the counting circuit and the refresh window signal generation circuit, and configured to: under a condition that the number of the plurality of first refresh commands is n, generate the counting reset signal after the n-th first refresh operation ends; and
a first pulse generation sub-circuit, coupled to the counting reset signal generation circuit and configured to: under a condition that the number of the plurality of first refresh commands is less than n, generate the first clock signal based on the counting signal; or under a condition that the number of the plurality of first refresh commands is equal to n, generate the second clock signal based on the counting reset signal.

4. The refresh address generation circuit of claim 2, wherein the refresh window signal generation circuit comprises:
n refresh window sub-signal generation circuits, each of the n refresh window sub-signal generation circuits is configured to receive the refresh window reset signal, and sequentially receive a corresponding first refresh command of the plurality of first refresh commands; and wherein the n refresh window sub-signal generation circuits are configured to sequentially output a plurality of refresh window sub-signals based on the plurality of first refresh commands and the refresh window reset signals; and
a refresh window sub-signal processing circuit, coupled to the n refresh window sub-signal generation circuits, and configured to sequentially receive the plurality of refresh window sub-signals, perform a logical operation on the plurality of refresh window sub-signals, and output the refresh window signal.

5. The refresh address generation circuit of claim 4, wherein the refresh control circuit is further configured to receive a second refresh command to perform a second refresh operation;
each of the n refresh window sub-signal generation circuits is configured to simultaneously receive the second refresh command and the refresh window reset signal, and each of the n refresh window sub-signal generation circuits is configured to generate the same refresh window sub-signal based on the second refresh command and the second refresh window reset signal; and
the refresh window sub-signal processing circuit is configured to receive the plurality of refresh window sub-signals, perform a logical operation on the plurality of refresh window sub-signals, and output the refresh window signal.

6. The refresh address generation circuit of claim 4, wherein the refresh control circuit further comprises:
a second pulse generation sub-circuit, coupled to the refresh window signal generation circuit, and configured to receive the refresh window signal and an address command signal, generate a first pulse of a third clock signal under a condition that the first refresh operation or the second refresh operation starts, and output a second pulse of the third clock signal based on a first pulse of the address command signal, to output the third clock signal;
an inner refresh window signal generation circuit, configured to generate an inner refresh window signal based on the third clock signal, wherein a first pulse of the inner refresh window signal is generated after the first pulse of the third clock signal and ends before the second pulse of the third clock signal is generated, and a second pulse of the inner refresh window signal is generated after the second pulse of the third clock signal and ends before a pulse of the refresh window signal ends;
an address command signal generation circuit, configured to generate the first pulse and a second pulse of the address command signal based on a valid level of a pre-charge signal, wherein the first pulse of the address command signal is used to generate the second pulse of the inner refresh window signal and the second pulse of the third clock signal, and the valid level of the pre-charge signal is a valid level generated in response to a falling edge of the inner refresh window signal; and
a refresh window reset signal generation circuit, configured to receive the pre-charge signal and generate a pulse of the refresh window reset signal based on a falling edge of a second pulse of the pre-charge signal.

7. The refresh address generation circuit of claim 6, wherein the refresh control circuit further comprises:
a signal selection circuit, coupled to the counting circuit, a first pulse generation sub-circuit, and a second pulse generation sub-circuit, and configured to: output the first clock signal or the second clock signal based on the counting signal under a condition that the refresh control circuit performs the first refresh operation; or output the third clock signal based on the counting signal under a condition that the refresh control circuit performs the second refresh operation.

8. The refresh address generation circuit of claim 7, wherein the refresh control circuit further comprises:
an address flag signal generation circuit, configured to generate a rising edge of an address flag signal based on a first rising edge of the address command signal and generate a falling edge of the address flag signal based on a falling edge of the refresh window signal; and
the address generator comprises:
an address counter, pre-storing the first address, coupled to the signal selection circuit, and configured to change the first address to a third address based on the second clock signal, or to change the first address based on the third clock signal and sequentially output a fourth address and a fifth address, wherein the first address, the fourth address, and the fifth address are three consecutive addresses; and
an address processing circuit, connected to the address counter and the n refresh window sub-signal generation circuits, and configured to receive the address flag signal under the condition that the refresh control circuit performs the first refresh operation, obtain the first address, and output the first address before the rising edge of the address flag signal arrives, or output a second address after the rising edge of the address flag signal arrives; wherein
the address processing circuit is further configured to:
under the condition that the refresh control circuit performs the second refresh operation, sequentially obtain the fourth address and the fifth address, and sequentially output the fourth address and the fifth address based on the plurality of refresh window sub-signals.

9. The refresh address generation circuit of claim 8, wherein the address processing circuit comprises:
an address operation circuit, coupled to the address counter, wherein the address operation circuit is configured to perform an addition operation or a subtraction operation on the first address to obtain the second address; and
an address selection circuit, coupled to the address counter, the address operation circuit, and the n refresh window sub-signal generation circuits, and configured to: in response to receiving the plurality of first refresh commands, output the first address under a condition that the address flag signal is at a low level or output the second address under a condition that the address flag signal is at a high level; or in response to receiving the second refresh commands, sequentially output the fourth address and the fifth address based on the plurality of refresh window sub-signals;
wherein the address selection circuit comprises:
a ninth AND gate, wherein input terminals of the ninth AND gate are respectively connected to the n refresh window sub-signal generation circuits;
an eleventh inverter, wherein an input terminal of the eleventh inverter is connected to the address flag signal generation circuit to receive the address flag signal;
a fourth NOR gate, wherein input terminals of the fourth NOR gate are respectively connected to an output terminal of the ninth AND gate and an output terminal of the eleventh inverter; and
a multiplexer, connected to the address counter, the address operation circuit, and the fourth NOR gate, and configured to: in response to a signal outputted by the fourth NOR gate, output the first address or the second address under a condition that the first refresh operation is performed; or output the fourth address or the third address under a condition that the second refresh operation is performed.

10. The refresh address generation circuit of claim 3, wherein the counting circuit comprises:
n first inverters, wherein each of the first inverters is configured to correspondingly receive one of the plurality of first refresh commands; and
n first latches, wherein set terminals of the n first latches are respectively connected to one of the first inverters, reset terminals of the n first latches are configured to receive the counting reset signal, output terminals of the n first latches are configured to output the counting signal, and the n first latches are reset based on the counting reset signal under the condition that the number of the first refresh operations is equal to the preset value;
wherein the counting reset signal generation circuit comprises:
a first AND gate, wherein an input terminal of the first AND gate is configured to receive the counting signal;
a second inverter, wherein an input terminal of the second inverter is connected to the refresh window signal generation circuit to invert the refresh window signal;
a second AND gate, wherein input terminals of the second AND gate are respectively connected to an output terminal of the first AND gate and an output terminal of the second inverter;

a first delayer, wherein an input terminal of the first delayer is connected to an output terminal of the second AND gate;
a third inverter, wherein an input terminal of the third inverter is connected to an output terminal of the first delayer;
a third AND gate, wherein input terminals of the third AND gate are respectively connected to the output terminal of the second AND gate and an output terminal of the third inverter; and
a fourth inverter, connected to an output terminal of the third AND gate to output the counting reset signal.

11. The refresh address generation circuit of claim 10, wherein the first pulse generation sub-circuit comprises:
a second delayer, wherein an input terminal of the second delayer is connected to the output terminal of the third AND gate;
a third delayer, wherein an input terminal of the third delayer is connected to an output terminal of the second delayer; and
a first OR gate, wherein input terminals of the first OR gate are respectively connected to the output terminal of the third AND gate and an output terminal of the third delayer, wherein an output terminal of the first OR gate outputs the first clock signal based on the counting signal under the condition that the number of the plurality of first refresh commands is less than n, or outputs the second clock signal based on the counting reset signal under the condition that the number of the plurality of first refresh commands is equal to n.

12. The refresh address generation circuit of claim 8, wherein the second pulse generation sub-circuit comprises:
a seventh delayer, wherein an input terminal of the seventh delayer is connected to the refresh window signal generation circuit to receive the refresh window signal;
a seventh inverter, wherein an input terminal of the seventh inverter is connected to an output terminal of the seventh delayer;
a sixth AND gate, wherein input terminals of the sixth AND gate are respectively connected to the refresh window signal generation circuit and an output terminal of the seventh inverter;
an eighth inverter, wherein an input terminal of the eighth inverter is connected to the address flag signal generation circuit;
a seventh AND gate, wherein input terminals of the seventh AND gate are respectively connected to an output terminal of the eighth inverter and the address command signal generation circuit;
a second NOR gate, wherein input terminals of the second NOR gate are respectively connected to an output terminal of the sixth AND gate and an output terminal of the seventh AND gate; and
a ninth inverter, wherein an input terminal of the ninth inverter is connected to an output terminal of the second NOR gate and an output terminal of the ninth inverter is connected to the signal selection circuit.

13. The refresh address generation circuit of claim 12, wherein the inner refresh window signal generation circuit comprises:
a fourth latch, wherein a set terminal of the fourth latch is connected to the output terminal of the second NOR gate and a reset terminal of the fourth latch is connected to the address command signal generation circuit, and the fourth latch is configured to generate the inner refresh window signal based on the third clock signal;

wherein the address command signal generation circuit comprises:
a fifth inverter, wherein an input terminal of the fifth inverter is configured to receive the pre-charge signal;
a fourth delayer, wherein an input terminal of the fourth delayer is connected to an output terminal of the fifth inverter; and
a fourth AND gate, wherein input terminals of the fourth AND gate are respectively connected to the output terminal of the fifth inverter and an output terminal of the fourth delayer, and the fourth AND gate is configured to output the address command signal.

14. The refresh address generation circuit of claim 13, wherein the address flag signal generation circuit comprises:
a sixth inverter, wherein an input terminal of the sixth inverter is connected to an output terminal of the fourth AND gate; and
a second latch, wherein a set terminal of the second latch is connected to an output terminal of the sixth inverter, and the second latch is configured to output the address flag signal.

15. The refresh address generation circuit of claim 14, wherein the refresh window reset signal generation circuit comprises:
a fifth AND gate, wherein input terminals of the fifth AND gate are configured to respectively receive the address flag signal outputted by the second latch and the pre-charge signal;
a sixth delayer, wherein an input terminal of the sixth delayer is connected to an output terminal of the fifth AND gate; and
a tenth inverter, connected to an output terminal of the sixth delayer and is configured to output the refresh window reset signal.

16. The refresh address generation circuit of claim 14, wherein the refresh window sub-signal generation circuit comprises:
a first NOR gate, wherein input terminals of the first NOR gate are configured to respectively receive the first refresh command and the second refresh command; and
a third latch, wherein a set terminal of the third latch is connected to an output terminal of the first NOR gate, a reset terminal of the third latch is connected to an output terminal of the tenth inverter, and an output terminal of the third latch is configured to output the refresh window sub-signal;
wherein the refresh window sub-signal processing circuit comprises:
a third OR gate, wherein input terminals of the third OR gate are respectively connected to output terminals of a plurality of third latches, to output the refresh window signal.

17. The refresh address generation circuit of claim 7, wherein the signal selection circuit comprises:
a third NOR gate, wherein an input terminal of the third NOR gate is configured to receive the counting signal;
a second OR gate, wherein input terminals of the second OR gate are respectively connected to the first pulse generation sub-circuit and the second pulse generation sub-circuit; and
an eighth AND gate, wherein input terminals of the eighth AND gate are respectively connected to an output terminal of the third NOR gate and an output terminal of the second OR gate, and an output terminal of the eighth AND gate is connected to the address generator.

18. A refresh address generation method, applied to the circuit according to claim 1, used in a same bank refresh mode, and comprising:
obtaining a number of first refresh operations performed by a refresh control circuit under a condition that the refresh control circuit receives first refresh commands;
under a condition that the number of the first refresh operations performed by the refresh control circuit is less than a preset value, controlling an address generator to maintain an address outputted by the address generator; and
under a condition that the number of the first refresh operations performed by the refresh control circuit is equal to the preset value, controlling the address generator to change the address outputted by the address generator.

19. The refresh address generation method of claim 18, further comprising:
under a condition that the refresh control circuit receives a second refresh command, controlling the address generator to output an all bank refresh address.

20. A memory, comprising a refresh address generation circuit, wherein the refresh address generation circuit comprises:
a refresh control circuit, configured to sequentially receive a plurality of first refresh commands, and perform first refresh operations respectively; and further configured to: under a condition that a number of the first refresh operations is less than a preset value, output a first clock signal; and under a condition that the number of the first refresh operations is equal to the preset value n, output a second clock signal, wherein n is a positive integer greater than or equal to 1; and
an address generator, coupled to the refresh control circuit, and configured to pre-store a first address and to receive the first clock signal or the second clock signal, wherein the address generator is further configured to: output a first to-be-refreshed address in response to the first clock signal during each of the first refresh operations, wherein the first to-be-refreshed address comprises the first address; and change the first address in response to the second clock signal.

* * * * *